United States Patent [19]
Nowak et al.

[11] Patent Number: 5,874,836
[45] Date of Patent: Feb. 23, 1999

[54] HIGH RELIABILITY I/O STACKED FETS

[75] Inventors: Edward J. Nowak; Minh H. Tong, both of Essex, Vt.

[73] Assignee: International Business Machines Corporation, Armonk, N.Y.

[21] Appl. No.: 709,061

[22] Filed: Sep. 6, 1996

[51] Int. Cl.⁶ .................................................. H03K 19/094
[52] U.S. Cl. .............................. 326/83; 326/87; 326/121
[58] Field of Search .................... 326/83, 86, 26, 326/27, 121

[56] References Cited

U.S. PATENT DOCUMENTS

| | | | |
|---|---|---|---|
| 4,342,927 | 8/1982 | Hull | 326/121 |
| 4,491,750 | 1/1985 | Janutka . | |
| 4,752,703 | 6/1988 | Lin . | |
| 4,857,763 | 8/1989 | Sakurai et al. . | |
| 4,920,287 | 4/1990 | Hartgring et al. . | |
| 5,170,078 | 12/1992 | Hsueh et al. . | |
| 5,175,445 | 12/1992 | Kinugasa et al. | 326/121 |
| 5,332,934 | 7/1994 | Hashimoto et al. | 326/121 |
| 5,378,943 | 1/1995 | Dennard | 326/121 |
| 5,410,267 | 4/1995 | Haycock et al. . | |
| 5,457,420 | 10/1995 | Asada . | |
| 5,479,116 | 12/1995 | Sallaerts et al. | 326/121 |
| 5,546,022 | 8/1996 | D'Souza et al. | 326/87 |

FOREIGN PATENT DOCUMENTS

| | | | |
|---|---|---|---|
| 404189026 | 7/1992 | Japan | 326/83 |
| 405183421 | 7/1993 | Japan | 326/121 |

OTHER PUBLICATIONS

"New Degradation Phenomena Induced by Ion–Implantation Channeling in Short Channel Transistors"*Abstracts of the Conference on Solid State Devices and Materials*, Tokyo, 1986, pp. 483–486.

*Primary Examiner*—Michael Tokar
*Assistant Examiner*—Daniel D. Chang
*Attorney, Agent, or Firm*—Whitham, Curtis & Whitham; Howard J. Walter, Esq.

[57] ABSTRACT

The effects on device reliability of across chip length variation (ACLV), gate ion channeling and dislocation are reduced or eliminated in input/output (I/O) stacked field effect transistors (FETs). A pair of stacked PFETs and a pair of stacked NFETs are connected to an I/O pad. The PFET and the NFET adjacent to the I/O pad are designed with a channel length greater than the PFET and NFET, respectively, further removed from the I/O pad. This has the effect of making the PFET and NFET adjacent to the I/O pad insensitive to leakage-induced effects. Alternatively, a Schottky or P/N junction diode may be connected between the node between the gate of the PFET adjacent to the I/O pad and the two PFETs, and another Schottky or P/N junction diode may be connected between the node between the two NFETs and the gate of the NFET adjacent to the I/O pad. The Schottky diodes act to clamp the nodes between the pair of PFETs and the pair of NFETs near the respective gate voltages. A similar clamping action can be accomplished using an NFET in place of the Schottky or P/N junction diode for the pair of PFETs and a PFET in place of the Schottky or P/N junction diode for the pair of NFETs.

10 Claims, 4 Drawing Sheets

5,874,836

HIGH RELIABILITY I/O STACKED FETS

BACKGROUND OF THE INVENTION

Field of the Invention

The present invention generally relates to input/output (I/O) buffer and receiver circuits for integrated circuit (IC) applications and, more particularly, to high reliability complementary metal oxide semiconductor (CMOS) I/O driver circuit comprising stacked field effect transistors (FETs) of the same type with voltage control means for preventing a node between the serially connected FETs from charging to a voltage greater than a predetermined voltage.

Background Description

In mixed voltage input/output (I/O) applications, the output buffers and receivers must interface with voltages higher than the internal chip voltage. To avoid high voltage stress across the field effect transistor (FET) terminals, circuit designers usually use stacked negative channel FETs (NFETs) and stacked positive channel FETs (PFETs) for the output buffers. A typical mixed voltage complementary metal oxide semiconductor (CMOS) I/O buffer is shown in FIG. 1 and comprises first and second stacked NFETs 11 and 12 and first and second stacked PFETs 13 and 14. The junction of the drains of PFET 13 and NFET 11 is connected to I/O pad 15. When the chip is in its high impedance state, both FETs 12 and 14 are off, and the I/O voltage can be at ground or 3.3 volts (V). If both the stacked NFETs 11 and 12 have the same gate length and the I/O pad is at 3.3 V, node A will be at 1.8 V−$V_t$, where $V_t$ is the threshold voltage of the NFET 11. Under normal circumstances, node A will remain at this level indefinitely since the NFET 12 has a lower threshold voltage, and hence higher leakage current than NFET 11. Similarly, if the I/O voltage stays at ground, node B will remain high due to the leakage current of PFET 14.

For simplicity, only the NFET reliability problem is discussed by way of introduction to the problem, but those skilled in the art will understand that the problem for the PFETs is similar. Unfortunately, the leakage current of NFET 12 is not always higher than that of NFET 11. Due to many known mechanisms, such as across chip length variation (ACLV), gate ion channeling or dislocation (pipe), excessively high NFET 11 leakage current can cause node A to rise to 3.3 V. This problem, if not fixed, will affect the oxide integrity and hot-e reliability of NFET 12.

Gate channeling is discussed in "New Degradation Phenomena Induced by Ion-Implantation Channeling in Short Channel Transistors" by Akihiro Nitayama, Hiroshi Takato, and Riichiro Shirota from The *Abstracts of the Conference on Solid State Devices and Materials*, Tokyo, 1986, pp.483–486. In low acceleration energy ion implantation threshold voltage, degradation is observed in short channel MOSFETs. The frequency of degraded transistors increases with decreasing gate length. This is a problem in device miniaturization. In short channel transistors the degradation decreases threshold voltage in sample without stopping oxide.

The ACLV effect describes differences between adjacent structures. For example, two adjacent FETs with identically drawn channel lengths can have different physical lengths on the wafer. These differences may be due to many factors, including etching effect and photolithography.

Dislocation effect is shown in FIG. 2. There is shown a gate 21 surrounded by a source/drain 22 having ion implant damage 23 along its edge 24. Unintended dopants can get into an NFET or PFET channel causing the threshold voltage to lower. A higher leakage current occurs as a result, and the effect on the leakage current is more severe in FETs with short channel lengths.

SUMMARY OF THE INVENTION

It is therefore an object of the present invention to provide a solution where the effects of ACLV, gate ion channeling and dislocation are reduced or eliminated.

According to the invention, a pair of stacked PFETs and a pair of stacked NFETs are connected to an I/O pad. The PFET and the NFET adjacent to the I/O pad are designed with a channel length greater than the PFET and NFET, respectively, further removed from the I/O pad. This has the effect of making the PFET and NFET adjacent to the I/O pad insensitive to leakage-induced effects. Alternatively, a Schottky or P/N junction diode may be connected between the node between the two PFETs and the gate of the PFET adjacent to the I/O pad, and another Schottky or P/N junction diode may be connected between the node between the two NFETs and the gate of the NFET adjacent to the I/O pad. The Schottky or P/N junction diodes act to clamp the nodes between the pair of PFETs and the pair of NFETs at or near the respective gate voltages. A similar clamping action can be accomplished using an NFET in place of the Schottky or P/N junction diode for the pair of PFETs and a PFET in place of the Schottky or P/N junction diode for the pair of NFETs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
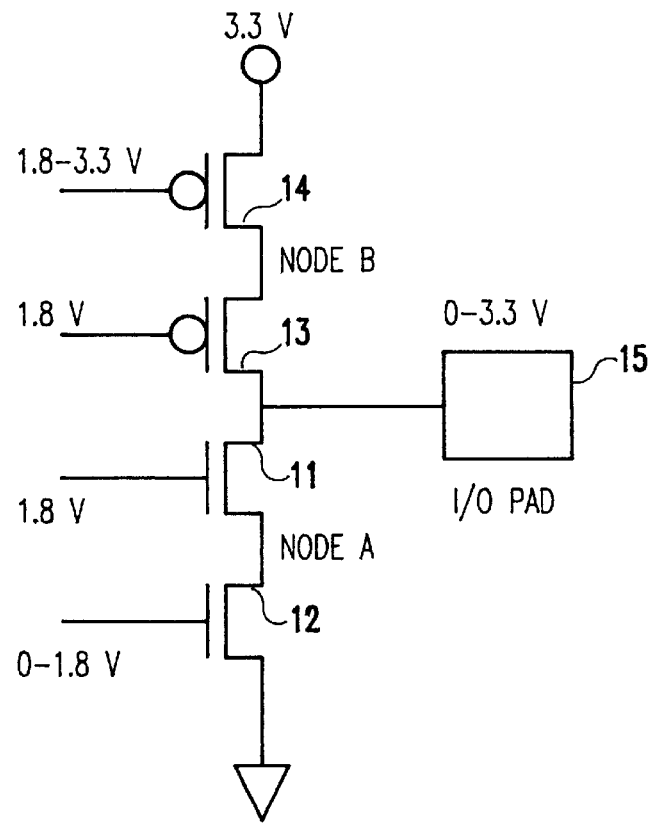
FIG. 1 is a schematic diagram showing a conventional I/O buffer comprised of stacked NFETs and stacked PFETs.
Figure 3:
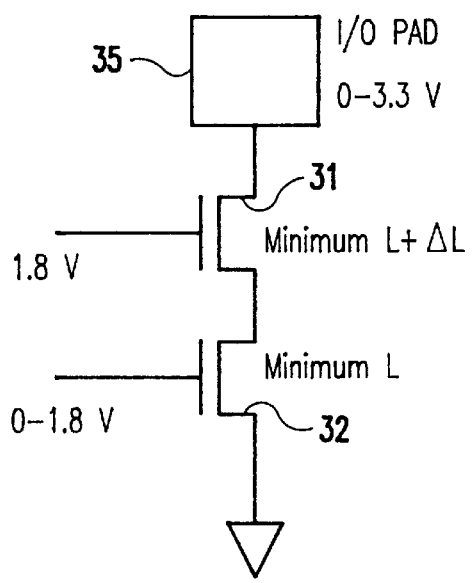
FIG. 3 is a schematic diagram showing stacked NFETs according to the present invention.
Figure 2:
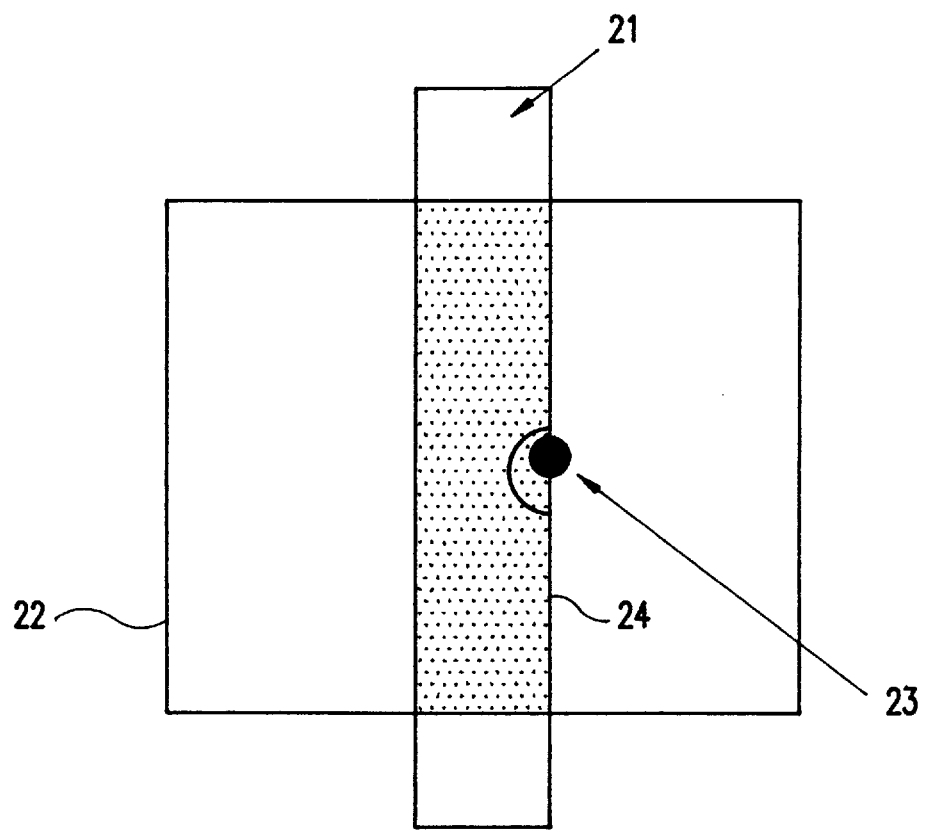
FIG. 2 is a plan view of a gate having ion implant damage.

Referring again to the drawings, and more particularly to FIG. 3, there is shown a simplified schematic diagram of two stacked NFETs 31 and 32 connected to the I/O pad 35. It will be understood that stacked PFETs (not shown) are also connected to I/O pad 35, in a similar fashion to the circuit of FIG. 1. The reliability problem is solved by making the channel length of NFET 31 longer than that of NFET 32. For example, NFET 32 and NFET 31 are designed with minimum channel length L and L+ΔL, respectively, where ΔL is some fraction of L. As an example, ΔL might be 0.1 micrometers (μm). With this design, NFET 31 is not sensitive to leakage-induced effects, while NFET 32 provides a sufficient leakage current. A similar solution is applied to the stacked PFETs (not shown).

Figure 4:
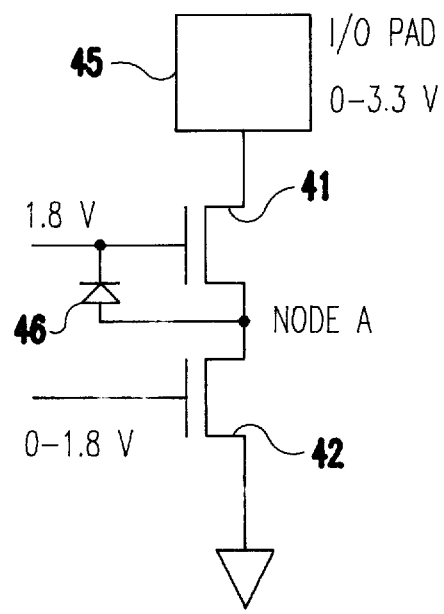
FIG. 4 is a schematic diagram showing an alternative solution according to the invention for stacked NFETs.
Figure 5:
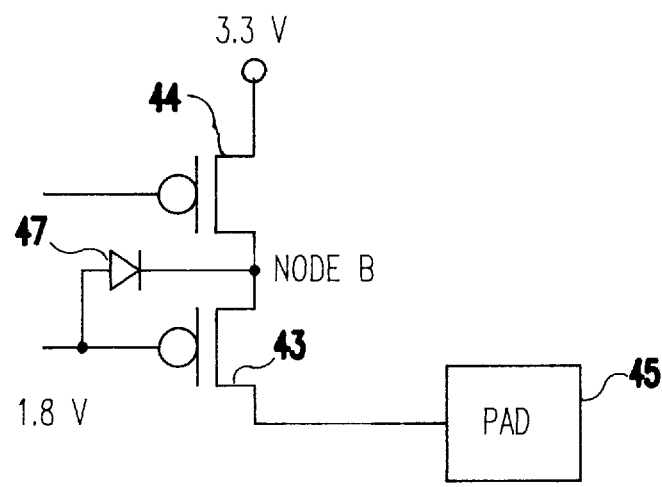
FIG. 5 is a schematic diagram showing the alternative solution of FIG. 4 for stacked PFETs.

An alternative solution is shown in FIG. 4 which shows two stacked NFETs 41 and 42 connected to I/O pad 45. A Schottky or P/N junction diode 46 is connected between node A and the gate of NFET 41, clamping node A near 1.8 V. The same solution is applied to the stacked PFETs as shown in FIG. 5. The two stacked PFETs 43 and 44 are connected to I/O pad 45, and a Schottky or P/N junction diode 47 is connected between node B and the gate of PFET 43, clamping node B near 1.8 V.

Figure 6:
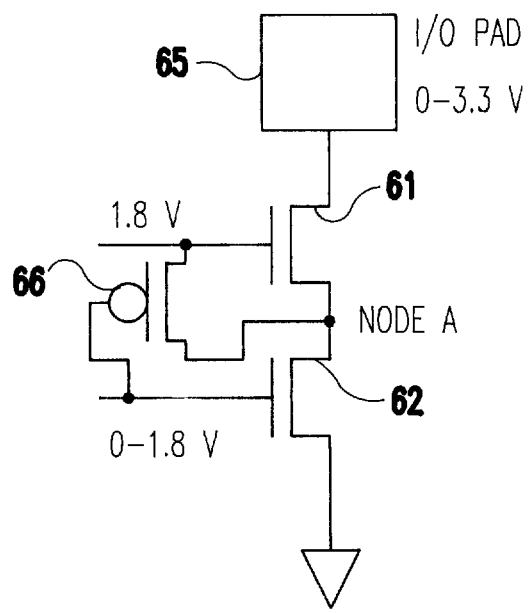
FIG. 6 is a schematic diagram showing yet another alternative solution according to the invention for stacked NFETs.
Figure 7:
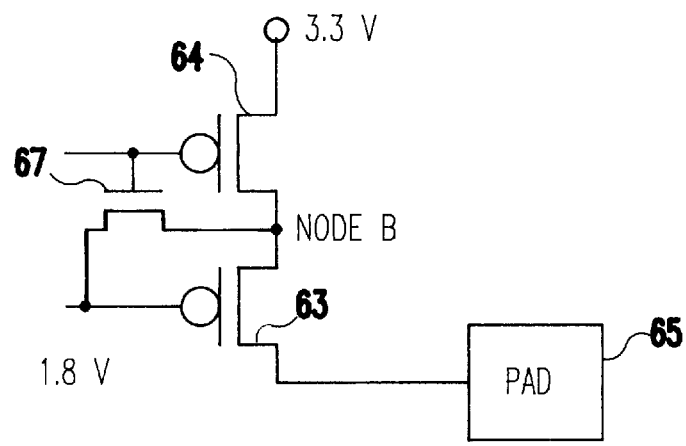
FIG. 7 is a schematic diagram showing the alternative solution of FIG. 6 for stacked PFETs.

Yet another alternative solution is shown in FIG. 6 which shows two stacked NFETs 61 and 62 connected to I/O pad 65. In this solution, a PFET 66 is connected between the gate of NFET 61 and node A with its gate connected to the gate of NFET 62. This alternative clamps node A at 1.8 V. This same solution is applied to the stacked PFETs as shown in FIG. 7. An NFET 67 is connected between the gate of PFET 63 and node B with its gate connected to the gate of PFET 64. This clamps node B at 1.8 V.

In both the alternative solutions shown in FIGS. 4 to 7, more chip area is required, but in some applications these alternative solutions may be more desirable for reasons of manufacture, reliability or the like. Thus, while the invention has been described in terms of a preferred embodiment and two alternative embodiments, those skilled in the art will recognize that the invention can be practiced with modification within the spirit and scope of the appended claims.

Having thus described our invention, what we claim as new and desire to secure by Letters Patent is as follows:

1. A complementary metal oxide semiconductor (CMOS) mixed voltage input/output (I/O) driver circuit comprising:
   a stack of at least first and second serially connected CMOS devices of the same type, said first CMOS device being connected to an I/O pad and said second CMOS device being connected to a voltage source, additional CMOS devices, if any, serially connected between the first and second CMOS devices, each of said serially connected CMOS device having a separate input gate signal;
   a mixed voltage driver which drives an output voltage higher than a chip operating voltage;
   a drain of one of said serially connected CMOS devices connected to a higher of voltage than a drain of another of said serially connected CMOS devices; and
   voltage control means for preventing a node between the serially connected first and second devices from charging to a voltage greater than a predetermined voltage.

2. The CMOS mixed voltage I/O driver circuit recited in claim 1 wherein said stack includes third and fourth serially connected CMOS devices of a type opposite the type of said first and second CMOS devices, said third CMOS device being connected to said I/O pad and said fourth CMOS device being connected to a second voltage source opposite to said first mentioned voltage source, further comprising second voltage control means for preventing a second node between the third and fourth serially connected devices from charging to a voltage greater than a second predetermined voltage.

3. The CMOS mixed voltage I/O driver circuit recited in claim 2 wherein said first and second voltage control means comprises an increased channel length of the first and third CMOS devices connected to said I/O pad as compared to a channel length of the second and fourth CMOS devices further removed from the I/O pad.

4. A complementary metal oxide semiconductor (CMOS) mixed voltage input/output (I/O) driver circuit comprising:
   a stack of at least first and second serially connected CMOS devices of the same type, said first CMOS device being connected to an I/O pad and said second CMOS device being connected to a voltage source;
   voltage control means for preventing a node between the serially connected first and second devices from charging to a voltage greater than a predetermined voltage;
   said stack further including at least third and fourth serially connected CMOS devices of a type opposite the type of said first and second CMOS devices, said third CMOS device being connected to said I/O pad and said fourth CMOS device being connected to a second voltage source opposite to said first mentioned voltage source, further comprising second voltage control means for preventing a second node between the third and fourth serially connected devices from charging to a voltage greater than a second predetermined voltage; and
   wherein said first mentioned voltage control means comprises a first clamping diode connected between said first mentioned node between the serially connected first and second CMOS devices and a gate of said first CMOS device, thereby clamping said first mentioned node to a voltage at the gate of said first CMOS device, and wherein said second voltage control means comprises a second clamping diode connected between said second node between the serially connected third and fourth CMOS devices and a gate of said third CMOS device, thereby clamping said second node to a voltage at the gate of said third CMOS device.

5. The CMOS mixed voltage I/O driver circuit recited in claim 2 wherein said first mentioned voltage control means comprises a fifth CMOS device of said second type connected between said first mentioned node between the serially connected first and second CMOS devices and a gate of said first CMOS device, a gate of said fifth CMOS device being connected to a gate of said second CMOS device, thereby clamping said first mentioned node to a voltage at the gate of said first CMOS device, and wherein said second voltage control means comprises a sixth CMOS device of said first mentioned type connected between said second node between the serially connected third and fourth CMOS devices and a gate of said third CMOS device, a gate of said sixth CMOS device being connected to a gate of said fourth CMOS device, thereby clamping said second node to a voltage at the gate of said third CMOS device.

6. High reliability input/output (I/O) stacked field effect transistors (FETs) wherein the effects of across chip length variation (ACLV), gate ion channeling and dislocation are reduced or eliminated, comprising:
   first and second stacked PFETs;
   first and second stacked NFETs; and
   an I/O pad, said first PFET and said first NFET being connected to the I/O pad, said first PFET and said first NFET being designed with a channel length greater than the second PFET and the second NFET, respectively, thereby making the first PFET and the first NFET insensitive to leakage-induced effects.

7. High reliability input/output (I/O) stacked field effect transtors (FETs) wherein the effects of across chip length variation (ACLV), gate ion channeling and dislocation are reduced or eliminated, comprising:
   first and second stacked PFETs;
   first and second stacked NFETs;
   an I/O pad, said first PFET and said first NFET being connected to the I/O pad; and first and second diodes, said first diode connected between a node between said first and second PFETs and a gate of the first PFET, and said second diode connected between a node between said first and second NFETs and a gate of the first NFET, said first and second diodes acting to clamp the nodes between the first and second PFETs and the first and second NFETs near the respective gate voltages of the first PFET and of the first NFET, thereby making the first PFET and the first NFET insensitive to leakage-induced effects.

8. High reliability input/output (I/O) stacked field effect transtors (FETS) as in claim 7 wherein said first and second diodes are Schottky diodes.

9. High reliability input/output (I/O) stacked field effect transtors (FETS) as in claim 7 wherein said first and second diodes are P/N junction diodes.

10. High reliability input/output (I/O) stacked field effect transistors (FETs) wherein the effects of across chip length variation (ACLV), gate ion channeling and dislocation are reduced or eliminated, comprising:

first and second stacked PFETs;

first and second stacked NFETs;

an I/O pad, said first PFET and said first NFET being connected to the I/O pad; and a third NFET connected between a node between said first and second PFETs and a gate of the first PFET, a gate of the third NFET being connected to a gate of the second PFET; and a third PFET connected between a node between said first and second NFETs and a gate of the first PFET, a gate of the third PFET being connected to a gate of the second NFET, said third NFET and said third PFET acting to clamp the nodes between the first and second PFETs and the first and second NFETs near the respective gate voltages of the first PFET and of the first NFET, thereby making the first PFET and the first NFET insensitive to leakage-induced effects.

* * * * *